(12) United States Patent
Pagaila

(10) Patent No.: US 8,501,544 B2
(45) Date of Patent: Aug. 6, 2013

(54) SEMICONDUCTOR DEVICE AND METHOD OF FORMING ADHESIVE MATERIAL OVER SEMICONDUCTOR DIE AND CARRIER TO REDUCE DIE SHIFTING DURING ENCAPSULATION

(75) Inventor: Reza A. Pagaila, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 32 days.

(21) Appl. No.: 13/185,384

(22) Filed: Jul. 18, 2011

(65) Prior Publication Data
US 2012/0049388 A1  Mar. 1, 2012

Related U.S. Application Data

(60) Provisional application No. 61/378,660, filed on Aug. 31, 2010.

(51) Int. Cl.
*H01L 23/488* (2006.01)
*H01L 21/56* (2006.01)

(52) U.S. Cl.
USPC ........... 438/118; 257/E21.499; 257/E21.502; 438/106; 438/107; 438/108; 438/109; 438/110; 438/125; 438/126

(58) Field of Classification Search
USPC .................. 257/E21.499, E21.502; 438/106, 438/107, 108, 109, 110, 118, 125, 126
See application file for complete search history.

(56) References Cited

U.S. PATENT DOCUMENTS

| | | | |
|---|---|---|---|
| 5,866,952 A * | 2/1999 | Wojnarowski et al. | 257/788 |
| 7,687,895 B2 | 3/2010 | Brunnbauer et al. | |
| 7,906,860 B2 | 3/2011 | Meyer et al. | |
| 2007/0080434 A1* | 4/2007 | Ho et al. | 257/666 |
| 2009/0061564 A1* | 3/2009 | Lytle et al. | 438/113 |
| 2009/0108440 A1 | 4/2009 | Meyer et al. | |
| 2010/0013076 A1 | 1/2010 | Jang et al. | |

\* cited by examiner

*Primary Examiner* — Peniel M Gumedzoe
(74) *Attorney, Agent, or Firm* — Robert D. Atkins; Patent Law Group: Atkins & Associates, P.C.

(57) ABSTRACT

A semiconductor device has a plurality of semiconductor die mounted to a carrier. An adhesive material is deposited over a portion of the semiconductor die and carrier to secure the semiconductor die to the carrier. The adhesive material is deposited over a side of the semiconductor die and over a surface of the carrier. The adhesive material can be deposited over a corner of the semiconductor die, or over a side of the semiconductor die, or around a perimeter of the semiconductor die. An encapsulant is deposited over the semiconductor die and carrier. The adhesive material reduces shifting of the semiconductor die with respect to the carrier during encapsulation. The adhesive material is cured and the carrier is removed. The adhesive material can also be removed. An interconnect structure is formed over the semiconductor die and encapsulant. The semiconductor die are singulated through the encapsulant and interconnect structure.

24 Claims, 10 Drawing Sheets

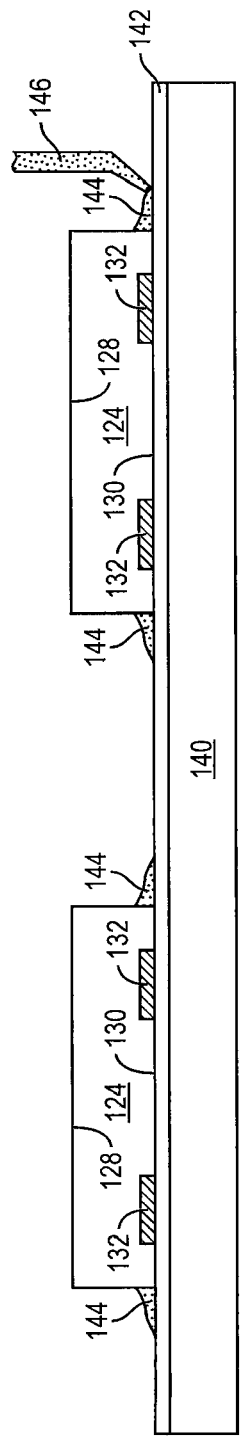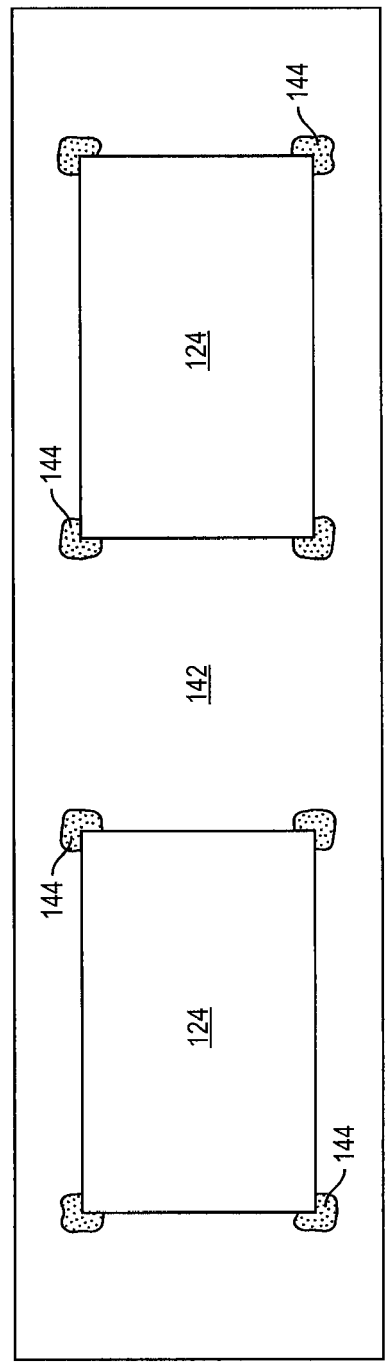

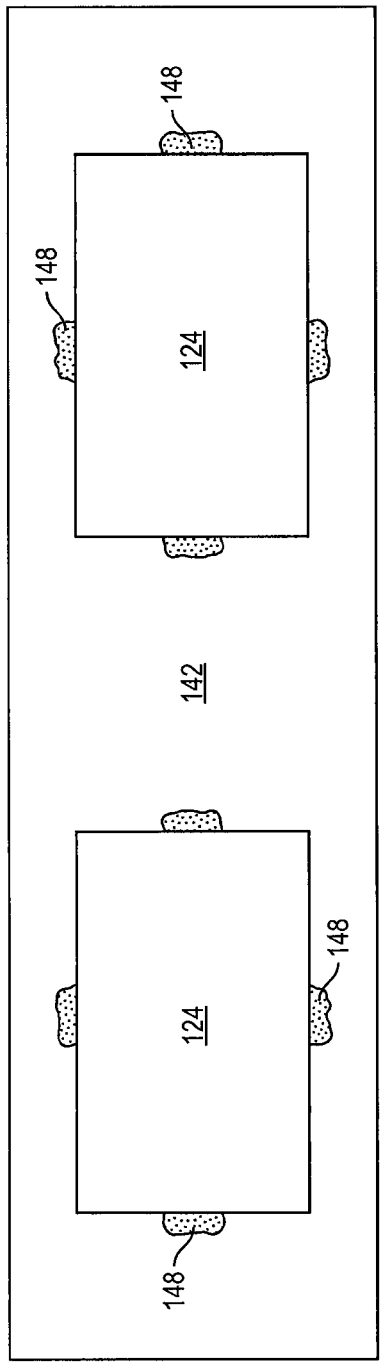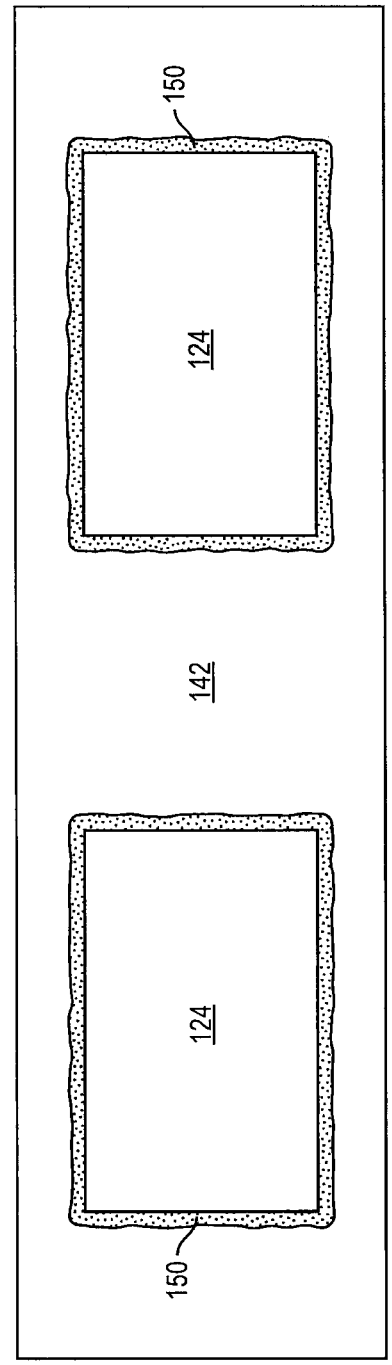

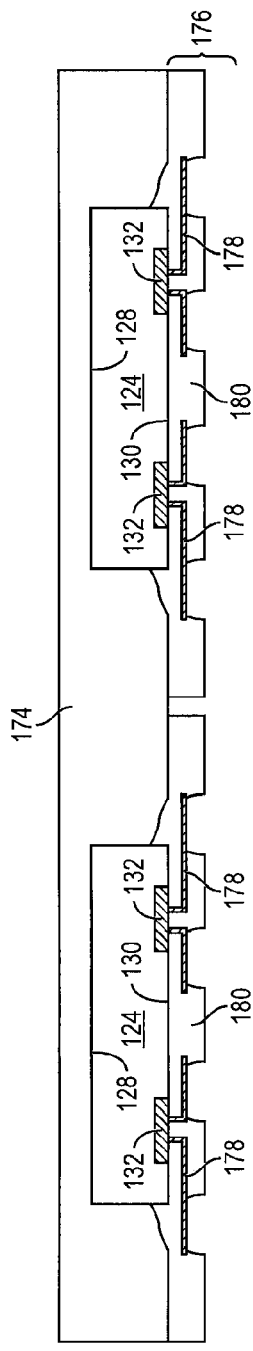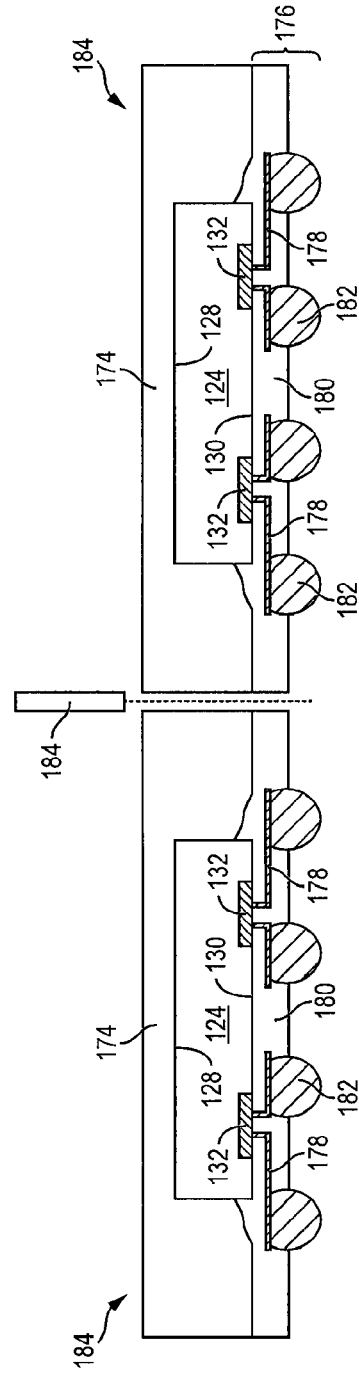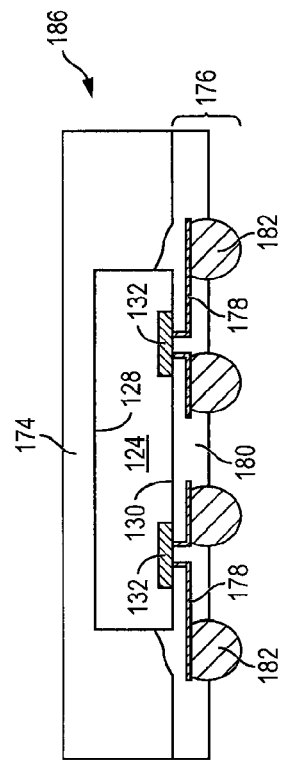

SEMICONDUCTOR DEVICE AND METHOD OF FORMING ADHESIVE MATERIAL OVER SEMICONDUCTOR DIE AND CARRIER TO REDUCE DIE SHIFTING DURING ENCAPSULATION

CLAIM TO DOMESTIC PRIORITY

The present application claims priority to Provisional Application No. 61/378,660, filed Aug. 31, 2010, and claims priority to the above applications pursuant to 35 U.S.C. §120.

FIELD OF THE INVENTION

The present invention relates in general to semiconductor devices and, more particularly, to a semiconductor device and method of forming an adhesive material over a semiconductor die and carrier to reduce die shifting during encapsulation and handling.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CODs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

In a fan-out wafer level chip scale package (Fo-WLCSP), a semiconductor die is commonly mounted to a temporary carrier. An encapsulant is deposited over the semiconductor die and carrier, typically by mold injection. The carrier is removed to expose the semiconductor die, and a build-up interconnect structure is formed over the exposed semiconductor die.

The semiconductor die is known to vertically and laterally shift during encapsulation, particularly during mold injection, which can cause misalignment of the build-up interconnect structure. One technique of securing the semiconductor die to the carrier to reduce die shifting involves forming wettable pads over the carrier and securing the semiconductor die to the wettable pads with bumps. The formation of wettable pads typically involves photolithography, etching, and plating, which are time consuming and costly manufacturing processes. The wettable pads and bumps increase interconnect resistance between the semiconductor die and build-up interconnect structure.

SUMMARY OF THE INVENTION

A need exists to reduce die shifting during encapsulation and handling. Accordingly, in one embodiment, the present invention is a method of making a semiconductor device comprising the steps of providing a carrier, mounting a plurality of semiconductor die to the carrier, depositing an adhesive material over the semiconductor die and carrier to secure the semiconductor die to the carrier, depositing an encapsulant over the semiconductor die and carrier, removing the carrier, and forming an interconnect structure over the semiconductor die and encapsulant. The adhesive material reduces shifting of the semiconductor die with respect to the carrier while depositing the encapsulant.

In another embodiment, the present invention is a method of making a semiconductor device comprising the steps of providing a carrier, mounting a semiconductor die to the carrier, depositing an adhesive material over the semiconductor die and carrier to secure the semiconductor die to the carrier, depositing an encapsulant over the semiconductor die and carrier, removing the carrier, and forming an interconnect structure over the semiconductor die and encapsulant.

In another embodiment, the present invention is a method of making a semiconductor device comprising the steps of providing a carrier, mounting a semiconductor die to the carrier, depositing an adhesive material over the semiconductor die and carrier, and depositing an encapsulant over the semiconductor die and carrier. The adhesive material reduces shifting of the semiconductor die with respect to the carrier while depositing the encapsulant.

In another embodiment, the present invention is a semiconductor device comprising a semiconductor die and adhesive material contacting the semiconductor die. An encapsulant is deposited over the semiconductor die and carrier. An interconnect structure is formed over the semiconductor die and encapsulant.

BRIEF DESCRIPTION OF THE DRAWINGS

FIGS. 4a-4k illustrate a process of forming an adhesive material over a semiconductor die and carrier to reduce die shifting during encapsulation and handling;

FIGS. 6a-6e illustrate another process of forming an adhesive material over a semiconductor die and carrier to reduce die shifting during encapsulation and handling; and FIG. 7 illustrates the semiconductor die with a build-up interconnect structure filling in the removed adhesive material.

DETAILED DESCRIPTION OF THE DRAWINGS

Figure 1:
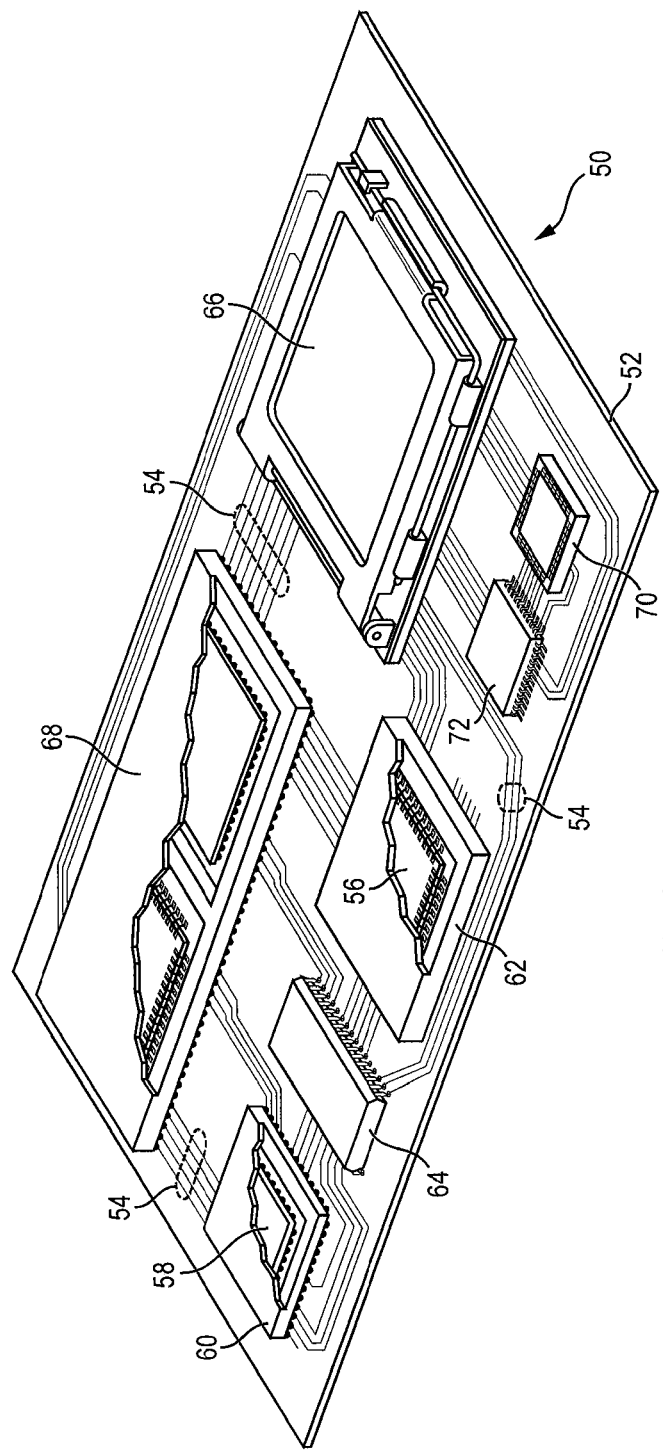
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
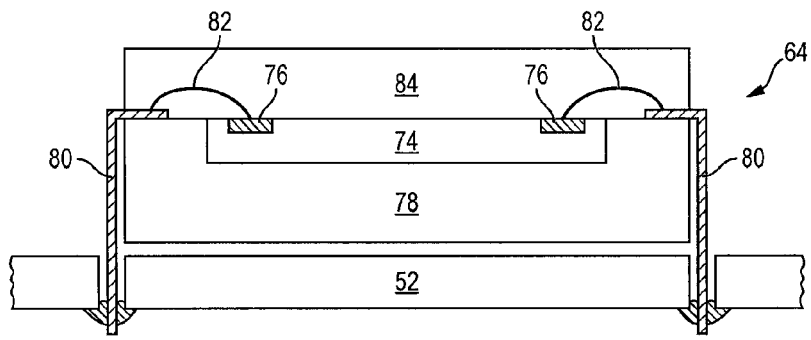
FIGS. 2a-2c illustrate further detail of the representative semiconductor packages mounted to the PCB.
Figure 2B:
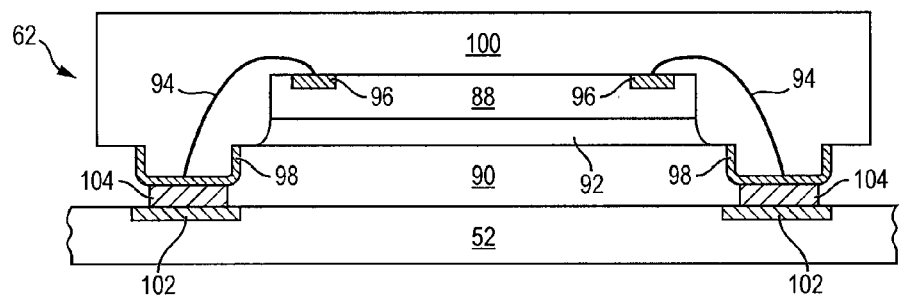
Figure 2C:
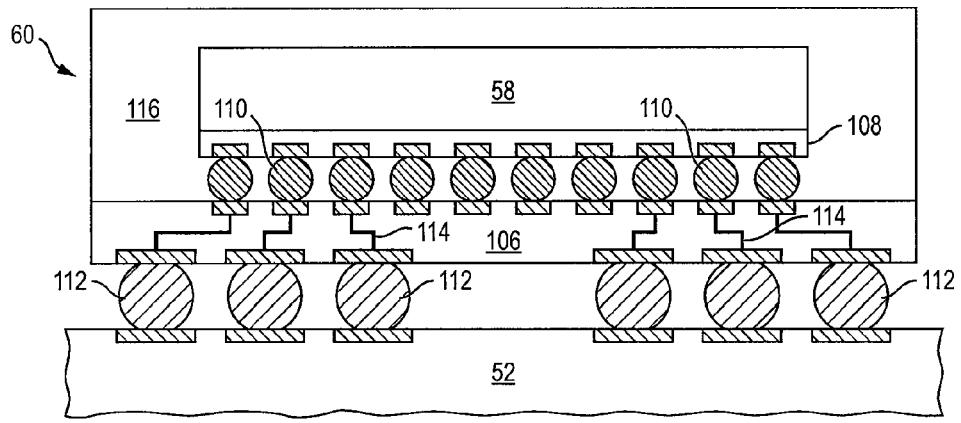

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
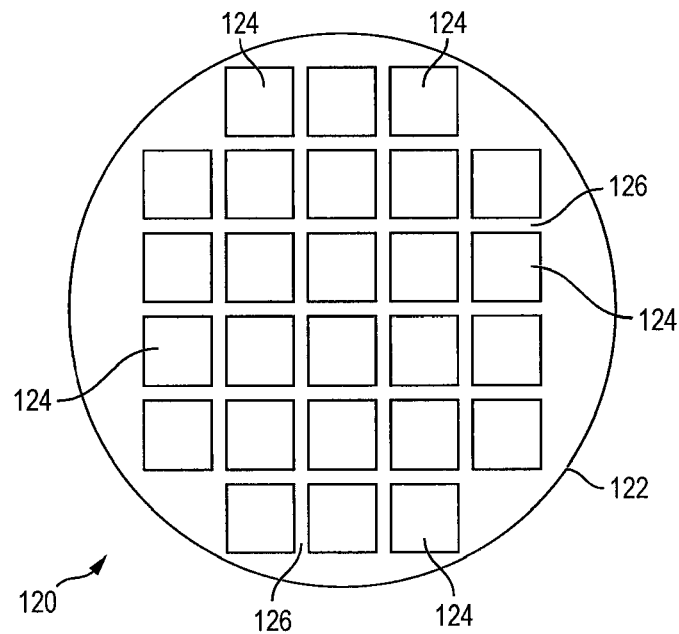
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
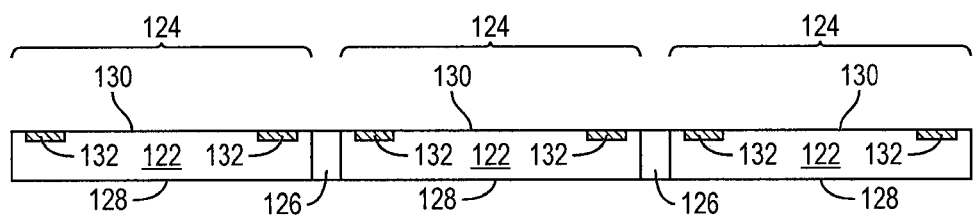

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
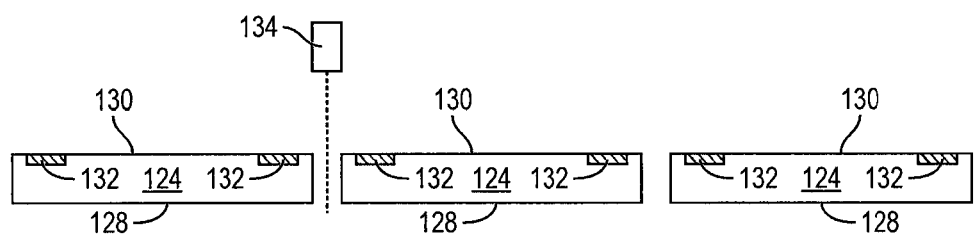

In FIG. 3c, semiconductor wafer 120 is singulated through saw street 126 using a saw blade or laser cutting tool 134 into individual semiconductor die 124.

Figure 4A:
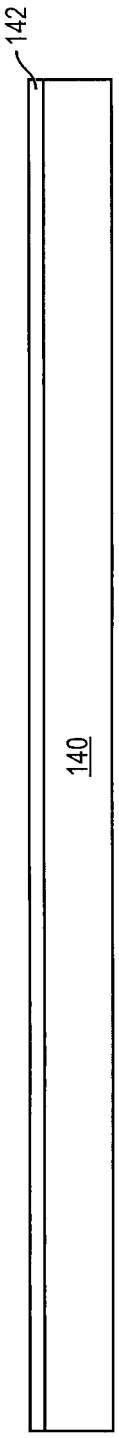

FIGS. 4a-4k illustrate, in relation to FIGS. 1 and 2a-2c, a process of depositing an adhesive material over a semiconductor die and carrier to reduce die shifting during encapsulation and handling. In FIG. 4a, a temporary substrate or carrier 140 contains sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer.

Figure 4B:
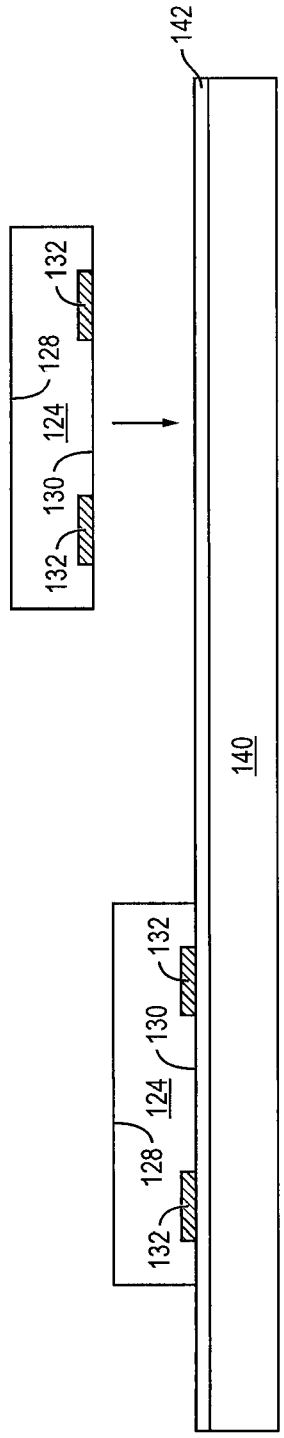
Figure 4C:
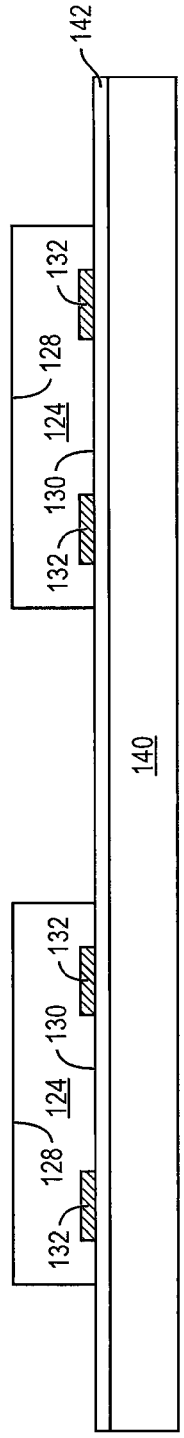

In FIG. 4b, semiconductor die 124 from FIGS. 3a-3c are positioned over and mounted to carrier 140 with active surface 130 and conductive layer 132 oriented toward the carrier. FIG. 4c shows semiconductor die 124 mounted to interface layer 142 and carrier 140 as a reconstituted semiconductor wafer 143.

In FIG. 4d, a non-conductive adhesive material 144 is deposited over the semiconductor die 124 and interface layer 142 using dispenser 146. Adhesive material 144 is deposited over a side surface of semiconductor die 124 down to the base of the semiconductor die and across a surface of interface layer 142. Adhesive material 144 can be an epoxy resin containing butadiene-acrylonitrile rubber with a carboxyl group as a fluxing agent, acid anhydride curing agent, and curing accelerator. Suitable epoxy resins include epoxy resin of bisphenol-A, epoxy resin of bisphenol-F, epoxy resin of phenol novolak, epoxy resin of bisphenol AD, epoxy resin of biphenyl, epoxy resin of naphthalene, alicyclic epoxy resin, epoxy resin of glycidyl ester, epoxy resin of glycidyl amine, heterocyclic epoxy resin, epoxy resin of diallyl sulfone, and epoxy resin of hydroquinone.

In particular, adhesive material 144 is applied at locations of a contact interface between the semiconductor die 124 and interface layer 142. FIG. 4e shows a top view of adhesive material 144 deposited over the corners of semiconductor die 124 where the semiconductor die contacts interface layer 142. FIG. 4f shows a top view of adhesive material 148 deposited over the sides of semiconductor die 124 where the semiconductor die contacts interface layer 142. FIG. 4g shows a top view of adhesive material 150 deposited around a perimeter of semiconductor die 124 where the semiconductor die contacts interface layer 142. The interface layer 142 itself may not have sufficient bonding strength to hold semiconductor die 124 to carrier 140 during encapsulation and handling. A sufficient quantity of adhesive material 144 is deposited over a side surface of semiconductor die 124 down to the base of the semiconductor die and across a top surface of interface layer 142 to provide additional bonding strength between semiconductor die 124 and interface layer 142 and carrier 140. Adhesive material 144 is cured.

Figure 4H:
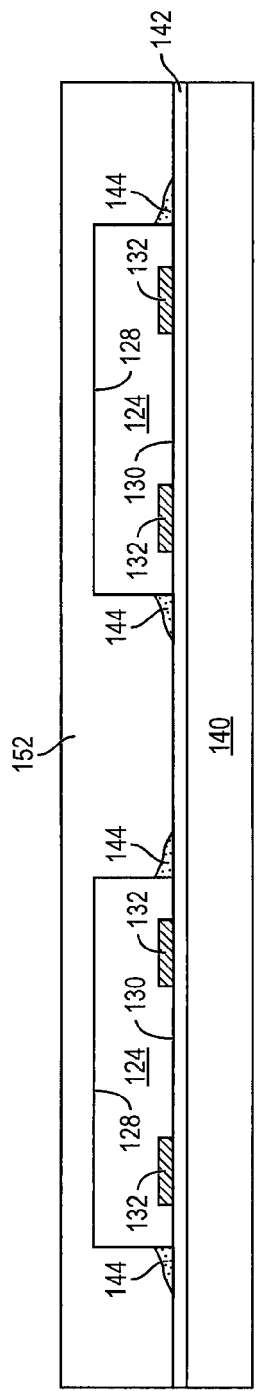

In FIG. 4h, an encapsulant or molding compound 152 is deposited over semiconductor die 124, carrier 140, and adhesive material 144 using a paste printing, compressive molding, transfer molding, liquid encapsulant molding, vacuum lamination, spin coating, or other suitable applicator. Encapsulant 152 can be polymer composite material, such as epoxy resin with filler, epoxy acrylate with filler, or polymer with proper filler. Encapsulant 152 is non-conductive and environmentally protects the semiconductor device from external elements and contaminants. Adhesive material 144 holds semiconductor die 124 securely in place over carrier 140 to reduce die shifting during encapsulation and handling.

Figure 4I:
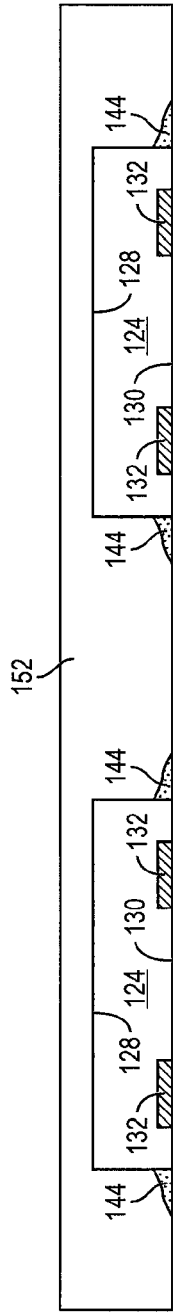

In FIG. 4i, carrier 140 and interface layer 142 are removed by chemical etching, mechanical peeling, CMP, mechanical grinding, thermal bake, UV light, laser scanning, or wet stripping to expose active surface 130, adhesive material 144, and encapsulant 152.

Figure 4J:
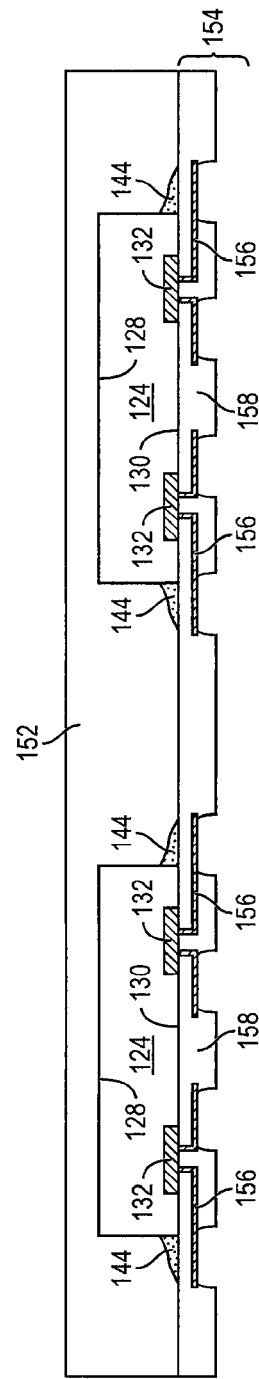

In FIG. 4j, a bottom-side build-up interconnect structure 154 is formed over active surface 130 of semiconductor die 124, adhesive material 144, and encapsulant 152. The build-up interconnect structure 154 includes an electrically conductive layer 156 formed using a patterning and metal deposition process such as sputtering, electrolytic plating, and electroless plating. Conductive layer 156 can be one or more layers of Al, Cu, Sn, Ni, Au, Ag, or other suitable electrically conductive material. In particular, conductive layer 156 includes vertical and horizontal portions for electrical interconnect. One portion of conductive layer 156 is electrically connected to conductive layer 132. Other portions of conductive layer 156 can be electrically common or electrically isolated depending on the design and function of semiconductor die 124.

The build-up interconnect structure 154 further includes an insulating or passivation layer 158 formed around and between conductive layers 156 for electrical isolation. The insulating layer 158 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 158 is formed using PVD, CVD, printing, spin coating, spray coating, sintering or thermal oxidation. A portion of insulating layer 158 is removed by an etching process through a photoresist layer (not shown) to expose conductive layer 156.

Figure 4K:
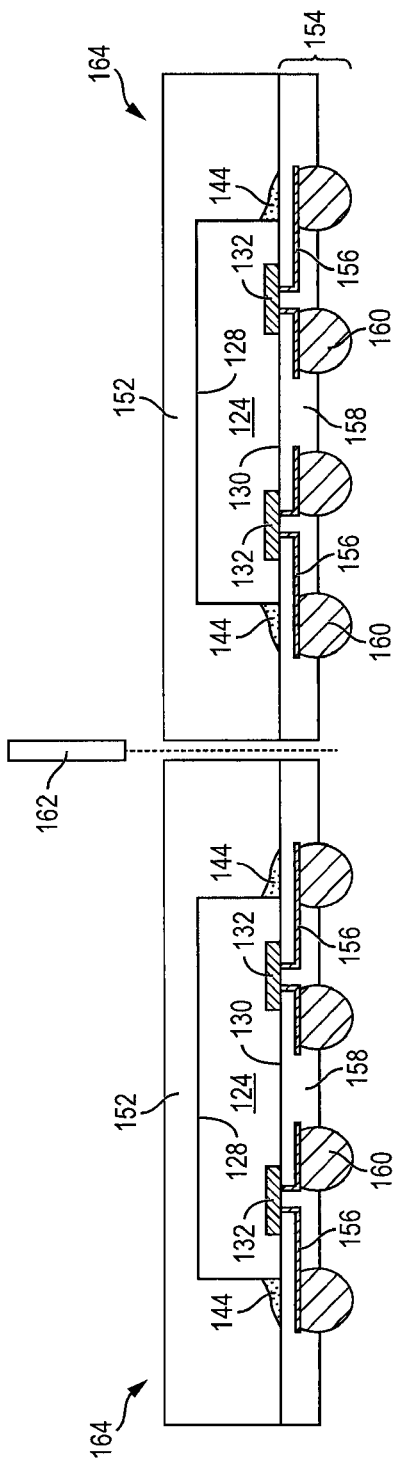

In FIG. 4k, an electrically conductive bump material is deposited over build-up interconnect structure 154 and electrically connected to the exposed conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form balls or bumps 160. In some applications, bumps 160 are reflowed a second time to improve electrical contact to conductive layer 156. Bumps 160 can also be compression bonded to conductive layer 156. Bumps 160 represent one type of interconnect structure that can be formed over conductive layer 156. The interconnect structure can also use stud bump, micro bump, or other electrical interconnect.

Figure 5:
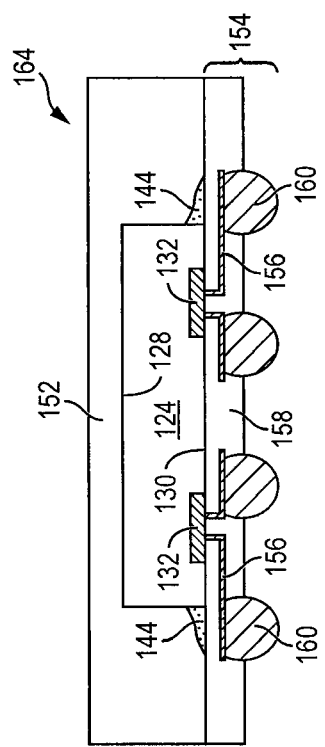
FIG. 5 illustrates the adhesive material deposited over the semiconductor die to reduce die shifting during encapsulation and handling.

Semiconductor die 124 are singulated through the encapsulant 152 and build-up interconnect structure 154 with saw blade or laser cutting tool 162 into individual Fo-WLCSP 164. FIG. 5 shows Fo-WLCSP 164 after singulation. Semiconductor die 124 is electrically connected to build-up interconnect structure 154 and bumps 160. The non-conductive adhesive material 144 securely holds semiconductor die in place to reduce die shifting during encapsulation and handling. Adhesive layer 144 remains during formation of build-up interconnect structure 154.

Figure 6A:
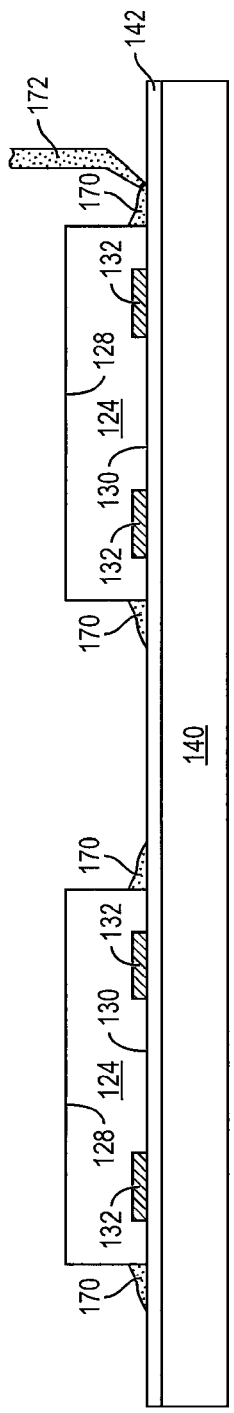

FIGS. 6a-6e illustrate, in relation to FIGS. 1 and 2a-2c, another process of depositing an adhesive material around a semiconductor die to reduce die shifting during encapsulation and handling. Continuing from FIG. 4c, a non-conductive adhesive material 170 is deposited over semiconductor die 124 and interface layer 142 using dispenser 172, as shown in FIG. 6a. Adhesive material 170 is deposited over a side surface of semiconductor die 124 down to the base of the semiconductor die and across a surface of interface layer 142. Adhesive material 170 can be an ultra-violet (UV) releasable B-stage polymer. In particular, adhesive material 170 can be applied at locations of the contact interface between the semiconductor die 124 and interface layer 142, similar to FIGS. 4e-4g. The interface layer 142 itself may not have sufficient bonding strength to hold semiconductor die 124 to carrier 140 during encapsulation and handling. A sufficient quantity of adhesive material 170 is deposited over a side surface of semiconductor die 124 down to the base of the semiconductor die and across a surface of interface layer 142 to provide additional bonding strength between semiconductor die 124 and interface layer 142 and carrier 140. Adhesive material 170 is cured.

Figure 6B:
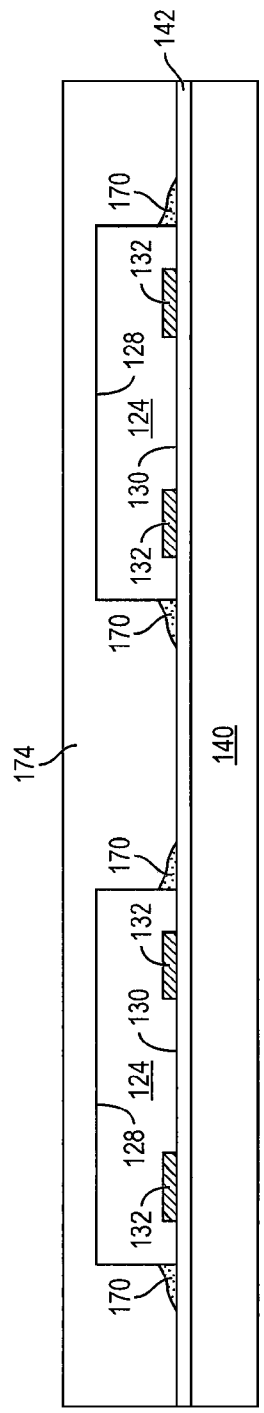

In FIG. 6b, an encapsulant or molding compound 174 is deposited over semiconductor die 124, carrier 140, and adhesive material 170 using a paste printing, compressive molding, transfer molding, liquid encapsulant molding, vacuum lamination, spin coating, or other suitable applicator. Encapsulant 174 can be polymer composite material, such as epoxy resin with filler, epoxy acrylate with filler, or polymer with proper filler. Encapsulant 174 is non-conductive and environmentally protects the semiconductor device from external elements and contaminants. Adhesive material 170 holds semiconductor die 124 securely in place over carrier 140 to reduce die shifting during encapsulation and handling.

Figure 6C:
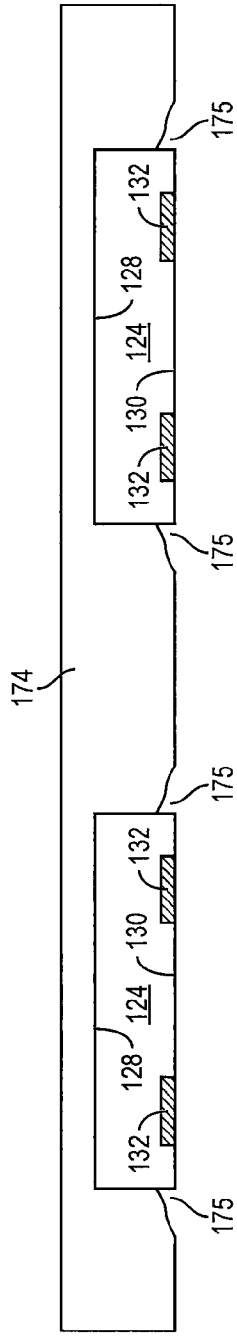

In FIG. 6c, carrier 140 and interface layer 142 are removed by chemical etching, mechanical peeling, CMP, mechanical grinding, thermal bake, UV light, laser scanning, or wet stripping to expose active surface 130 and encapsulant 152. Adhesive material 170 is also removed by exposure to UV, wet etching process, or application of heat, leaving cavities 175 in encapsulant 174.

In FIG. 6d, a bottom-side build-up interconnect structure 176 is formed over active surface 130 of semiconductor die 124 and encapsulant 174. The build-up interconnect structure 176 includes an electrically conductive layer 178 formed using a patterning and metal deposition process such as sputtering, electrolytic plating, and electroless plating. Conductive layer 178 can be one or more layers of Al, Cu, Sn, Ni, Au, Ag, or other suitable electrically conductive material. In particular, conductive layer 178 includes vertical and horizontal portions for electrical interconnect. One portion of conductive layer 178 is electrically connected to conductive layer 132. Other portions of conductive layer 178 can be electrically common or electrically isolated depending on the design and function of semiconductor die 124.

The build-up interconnect structure 176 further includes an insulating or passivation layer 180 formed around and between conductive layers 178 for electrical isolation. The insulating layer 180 contains one or more layers of SiO2, Si3N4, SiON, Ta2O5, Al2O3, or other material having similar insulating and structural properties. The insulating layer 180 is formed using PVD, CVD, printing, spin coating, spray coating, sintering or thermal oxidation. The insulating layer 180 fills in cavities 175 left by removal of adhesive material 170 to reduce the chance of delamination between semiconductor die 124 and build-up interconnect structure 176. A portion of insulating layer 180 is removed by an etching process through a photoresist layer to expose conductive layer 178.

In FIG. 6e, an electrically conductive bump material is deposited over build-up interconnect structure 176 and electrically connected to the exposed conductive layer 178 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 178 using a suitable attachment or bonding process. In one embodiment, the bump material is reflowed by heating the material above its melting point to form balls or bumps 182. In some applications, bumps 182 are reflowed a second time to improve electrical contact to conductive layer 178. Bumps 182 can also be compression bonded to conductive layer 178. Bumps 182 represent one type of interconnect structure that can be formed over conductive layer 178. The interconnect structure can also use stud bump, micro bump, or other electrical interconnect.

Semiconductor die 124 are singulated through the encapsulant 174 and build-up interconnect structure 176 with saw blade or laser cutting tool 184 into individual Fo-WLCSP 186. FIG. 7 shows Fo-WLCSP 186 after singulation. Semiconductor die 124 is electrically connected to build-up interconnect structure 176 and bumps 182. The non-conductive adhesive material 170 securely holds semiconductor die in place to reduce die shifting during encapsulation and handling. Adhesive layer 170 is removed after encapsulation and prior to forming build-up interconnect structure 176.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a carrier;
   disposing a semiconductor die over the carrier;
   depositing an adhesive material over a portion of the semiconductor die and carrier to secure the semiconductor die to the carrier;
   depositing an encapsulant over the semiconductor die and between portions of the adhesive material extending to the carrier, wherein the adhesive material reduces shifting of the semiconductor die with respect to the carrier;
   removing the carrier; and
   forming an interconnect structure over the semiconductor die and encapsulant.

2. The method of claim 1, further including removing the adhesive material.

3. The method of claim 1, further including depositing the adhesive material over a side of the semiconductor die and over a surface of the carrier.

4. The method of claim 1, further including depositing the adhesive material over a corner of the semiconductor die.

5. The method of claim 1, further including depositing the adhesive material over a side of the semiconductor die.

6. The method of claim 1, further including depositing the adhesive material around a perimeter of the semiconductor die.

7. A method of making a semiconductor device, comprising:
proviing a carrier;
disposing a semiconductor die over the carrier;
depositing an adhesive material over a portion of the semiconductor die and carrier to secure the semiconductor die to the carrier;
depositing an encapsulant over the semiconductor die and extending to the carrier;
removing the adhesive material; and
forming an interconnect structure over the semiconductor die and encapsulant.

8. The method of claim 7, wherein the adhesive material reduces shifting of the semiconductor die with respect to the carrier during encapsulation.

9. The method of claim 7, further including depositing the adhesive material over a side of the semiconductor die and over a surface of the carrier.

10. The method of claim 7, further including depositing the adhesive material over a corner of the semiconductor die.

11. The method of claim 7, further including depositing the adhesive material over a side of the semiconductor die.

12. The method of claim 7, further including depositing the adhesive material around a perimeter of the semiconductor die.

13. A method of making a semiconductor device, comprising:
providing a carrier;
disposing a semiconductor die over the carrier;
depositing an adhesive material over a side surface of the semiconductor die and carrier to secure the semiconductor die to the carrier;
depositing an encapsulant over the semiconductor die and extending to the carrier, wherein the adhesive material reduces shifting of the semiconductor die while depositing the encapsulant;
removing the carrier; and
removing the adhesive material deposited over the side surface of the semiconductor die.

14. The method of claim 13, further including forming an interconnect structure over the semiconductor die and encapsulant.

15. The method of claim 13, further including depositing the adhesive material over a corner of the semiconductor die.

16. The method of claim 13, further including depositing the adhesive material around a perimeter of the semiconductor die.

17. A method of making a semiconductor device, comprising:
providing a carrier;
disposing a semiconductor die over a surface of the carrier;
depositing an adhesive material over the surface of the carrier and surfaces of the semiconductor die oriented perpendicular to the surface of the carrier with all other surfaces of the semiconductor die devoid of the adhesive material;
depositing an encapsulant over the semiconductor die and carrier, wherein the adhesive material reduces shifting of the semiconductor die with respect to the carrier while depositing the encapsulant;
removing the carrier; and
completely removing the adhesive material deposited over the surfaces of the semiconductor die.

18. The method of claim 17, further including:
removing the carrier; and
forming an interconnect structure over the semiconductor die and encapsulant.

19. The method of claim 17, further including depositing the adhesive material over a corner of the semiconductor die.

20. The method of claim 17, further including depositing the adhesive material around a perimeter of the semiconductor die.

21. A method of making a semiconductor device, comprising:
providing a carrier;
disposing a semiconductor die over the carrier;
depositing an adhesive material over side surfaces of the semiconductor die and carrier;
depositing an encapsulant over the semiconductor die and extending to the carrier;
removing the carrier; and
removing the adhesive material deposited over the side surfaces of the semiconductor die.

22. The method of claim 21, further including forming an interconnect structure over the semiconductor die and encapsulant.

23. The method of claim 21, further including depositing the adhesive material over a corner of the semiconductor die.

24. The method of claim 21, further including depositing the adhesive material around a perimeter of the semiconductor die.

* * * * *